US011190033B2

(12) United States Patent
Lollo et al.

(10) Patent No.: US 11,190,033 B2
(45) Date of Patent: Nov. 30, 2021

(54) ADAPTOR FOR A DEVICE TO BUS CONTACT CONNECTION

(71) Applicant: FRANCE BREVETS, Paris (FR)

(72) Inventors: Daniel Lollo, Paris (FR); Timothée Le Quesne, Versailles (FR); Matthieu Poidatz, Dornes (FR)

(73) Assignee: ENERGYSQUARE, Saint-Mande (FR)

( * ) Notice: Subject to any disclaimer, the term of this patent is extended or adjusted under 35 U.S.C. 154(b) by 0 days.

(21) Appl. No.: 16/627,045

(22) PCT Filed: Jul. 3, 2018

(86) PCT No.: PCT/EP2018/068011
§ 371 (c)(1),
(2) Date: Dec. 27, 2019

(87) PCT Pub. No.: WO2019/007997
PCT Pub. Date: Jan. 10, 2019

(65) Prior Publication Data
US 2020/0127477 A1    Apr. 23, 2020

(30) Foreign Application Priority Data
Jul. 3, 2017    (EP) .................................... 17305858

(51) Int. Cl.
*H01M 10/44*    (2006.01)
*H01M 10/46*    (2006.01)
(Continued)

(52) U.S. Cl.
CPC .......... *H02J 7/0044* (2013.01); *G06F 13/122* (2013.01); *H02J 7/00036* (2020.01);
(Continued)

(58) Field of Classification Search
CPC ...... H02J 7/0044; H02J 7/0045; H02J 7/0042; H02J 7/0043; G06F 13/122; H01R 13/70
(Continued)

(56) References Cited

U.S. PATENT DOCUMENTS

| 7,392,068 B2 | 6/2008 | Dayan et al. |
| 2007/0088249 A1 | 4/2007 | Duffy |

(Continued)

FOREIGN PATENT DOCUMENTS

| WO | 2009065419 A1 | 5/2009 |
| WO | 2017046458 A1 | 3/2017 |

OTHER PUBLICATIONS

International Search Report and Written Opinion for PCT/EP2018/068011, dated Aug. 6, 2018.

*Primary Examiner* — Edward Tso
(74) *Attorney, Agent, or Firm* — Meagher Emanuel Laks Goldberg & Liao, LLP

(57) ABSTRACT

The invention discloses an adaptor or coupling arrangement for a device to bus contact connection. According to the invention, the coupling arrangement may be integrated in the device or configured to mate externally to the device. The coupling arrangement comprises electrical contact areas configured to mate to a mating surface that is itself configured to connect to a power line, one or more data lines, or both. The coupling arrangement also comprises an electronic circuit that is configured to perform one or more anti-inversion of current functions. Thus the coupling arrangement of the invention allows detection of the current connections established or not with conductive areas of the mating surface. Also, the coupling arrangement operates as a protection circuit that prevents any short circuit, whatever the positioning of the device on the mating surface. The
(Continued)

coupling arrangement may be used to operate smart phones, tablets, laptops or other types of electrical appliances.

16 Claims, 8 Drawing Sheets

(51) Int. Cl.
*H02J 7/00* (2006.01)
*G06F 13/12* (2006.01)
*H03K 17/06* (2006.01)

(52) U.S. Cl.
CPC ...... *H02J 7/00041* (2020.01); *H02J 7/00043* (2020.01); *H03K 17/063* (2013.01)

(58) Field of Classification Search
USPC ................. 320/114, 140, 162, 163, 164, 107
See application file for complete search history.

(56) References Cited

U.S. PATENT DOCUMENTS

| | | | |
|---|---|---|---|
| 2013/0140913 A1* | 6/2013 | Inha | H03K 17/687 307/126 |
| 2017/0040812 A1 | 2/2017 | Li | |

* cited by examiner

ADAPTOR FOR A DEVICE TO BUS CONTACT CONNECTION

FIELD OF THE INVENTION

The invention applies to unattached, free or loose contact connections between an electric or electronic device and a power or data bus. More specifically, an adaptor is provided to allow such a free connection between the device and a coupling interface.

BACKGROUND

There are more and more electronic devices in use (Desktop PCs, computers, laptops, tablets, smart phones, wearable devices, TV sets, set top boxes, game consoles, IoT devices or the like, etc.). These devices have more and more functionalities (navigation, activity monitoring, image and video acquisition and replay, etc.) and use more and more communication bandwidth, thus needing more and more power, even when equipped with low power processors. They therefore need to be recharged more and more often. Often times they need to be recharged while in use, i.e. transmitting data, either at home, in the office, in one's car or in public facilities such as airports, stations, trains, etc.

The same requirements apply to a number of electric devices or appliances that may be battery powered or not, such as lamps, coffee machines or cooking appliances.

While in general use, plugs have the drawback to be dedicated to a specific line (power line or data line). They require wires and only can accommodate a plurality of devices with a strip.

The drawbacks may be mitigated in part by using charging devices that are coupled to target devices by induction coils. But the cost of this charging method is significant since it requires two coils (one in the charging station and the other one in the target device).

Free contact charging devices have also been developed, such as the ones of the type disclosed by US U.S. Pat. No. 7,392,068. Free contact means that there is a physical contact connexion between the charging device and the device to be charged, but no coils are used. Such a charging device comprises a conductive surface with cells that are configured to establish an electric connection with a device to be charged through contact areas when a definite positioning is achieved. The capability of the charging devices of this type to detect different types of devices is limited, the detection method being specific to a type of device.

The applicant of the instant patent application has developed a system that enlarges the field of use of free contact connections. Such a system is disclosed in the PCT application published under number WO2017/046458.

Such charging devices are more versatile than the charging devices of the prior art and the coupling devices are also more adaptive to different kinds of devices to be charged and more cost effective than those of the prior art.

This type of charging and coupling devices have still some drawbacks, notably in that the detection of the device to be charged by the charging device is limited to specific form factors that impact the number and types of devices to be charged. Also, the system is not configured to easily provide connections to other buses than a power bus.

It is an object of the present invention to overcome these drawbacks of the prior art.

SUMMARY OF THE INVENTION

The invention provides a solution to the above mentioned problems by procuring a coupling arrangement between an electrically powered device and a powering device, the coupling arrangement being integrated in or attached to the device to be powered and comprising an electronic circuit that provides a function of double anti-inversion of a current circulating in the coupling arrangement.

More precisely, the invention discloses a coupling arrangement configured to switch one or more bus wires between a device and a mating surface between a closed state and an open state, the device being electrically powered at a characteristic voltage, the coupling arrangement comprising: at least as many electrical contact areas between the device and the mating surface as a count of the one or more bus wires; one or more electronic circuits, having together at least a first input/output (I/O), a second I/O, a third I/O and a fourth I/O, the first I/O and the third I/O being connected to the electrical contact areas, the second I/O and the fourth I/O being configured to be put in electrical connection with at least one of the one or more of the bus wires of the device; wherein the electronic circuit is adapted to perform one or more of a first anti-inversion of current function between the first I/O and the second I/O or a second anti-inversion of current function between the fourth I/O and the third I/O wherein the electronic circuit comprises a resistance (420) of a predetermined value between the second I/O and the fourth I/O, wherein the predetermined value is set as a function of the value of the characteristic operating voltage, whereby the resistance is detected when said device is correctly positioned on said mating surface.

Advantageously, the bus connection is in a closed state when a voltage of the first I/O equals a first voltage value within a predefined tolerance margin and a voltage of the third I/O equals a second voltage value within the predefined tolerance margin.

Advantageously, the bus connection is in an open state when a voltage of the first I/O equals a second voltage value within a predefined voltage tolerance margin and a voltage of the third I/O equals a first voltage value within the predefined voltage tolerance margin.

Advantageously, the one or more electronic circuits comprise a MOSFET-P transistor the drain of which is connected to the first I/O, the source of which is connected to the second I/O and the gate of which is connected to the third I/O and the fourth I/O.

Advantageously, the one or more electronic circuits comprise a MOSFET-N transistor the gate of which is connected to the first I/O and the second I/O, the drain of which is connected to the third I/O and the source of which is connected to the fourth I/O.

Advantageously, the one or more electronic circuits comprise a MOSFET-P transistor and a MOSFET-N transistor.

Advantageously, a MOSFET transistor has an internal resistance between its source and gate of a predetermined value.

Advantageously, one of the one or more bus connections is configured to transmit power from the mating surface to the device.

Advantageously, a distance between any of the electrical contact areas and a neighboring electrical contact area is larger than a characteristic dimension of the mating surface.

Advantageously, the electrical contact areas are located on a surface of the device and the one or more electronic circuits are located in an interior of the device.

Advantageously, the surface of the device and the electrical contact areas are configured in such a way that, when the device is positioned on the mating surface, it is capable to hold a position of stable balance and the one or more bus connections between the device and the mating surface may be closed.

Advantageously, the electrical contact areas and the one or more electronic circuits are located on an accessory that is configured to be engaged with the device and further comprises one or more male connectors to one or more ports of the one or more bus connections of the device.

Advantageously, the accessory and the electrical contact areas are configured in such a way that, when the accessory is engaged with the device and the device is positioned on the mating surface, the device is capable to hold a position of stable balance and the one or more bus connections between the device and the mating surface may be closed.

Advantageously, at least a male connector further comprises a female connector that mirrors the port in which the male connector is to be engaged, the female connector being perpendicular to the male connector.

Advantageously, a wire link between the accessory and a male connector is retractable in the accessory.

The invention also discloses a method of coupling a device and a mating surface in a manner that allows switching one or more bus wires between a closed state and an open state, the device being electrically powered, the method comprising: providing at least as many electrical contact areas between the device and the mating surface as a count of the one or more bus wires; providing one or more electronic circuits having together a first input/output (I/O), a second I/O, a third I/O and a fourth I/O, the first I/O and the third I/O being connected to the electrical contact areas, the second I/O and the fourth I/O being configured to be put in electrical connection with at least one of the one or more of the bus wires of the device; providing a resistance (420) of a predetermined value between the second I/O and the fourth I/O, wherein the predetermined value is set as a function of the value of the characteristic operating voltage, wherein the electronic circuit is adapted to perform one or more of a first anti-inversion of current function between the first I/O and the second I/O or a second anti-inversion of current function between the fourth I/O and the third I/O, and to detect the resistance value when the device is correctly positioned on said mating surface.

Among other advantages, the invention provides a coupling arrangement that may be adapted to a large variety of electric and/or electronic devices.

The coupling arrangement of the invention may be either configured to be attached externally to the device to be powered or adapted to be integrated in the device at the time of production.

The coupling arrangement of the invention provides a safe detection of the available connections that avoids consequences of a faulty positioning.

To this effect, different kinds of standard electronic components may be used, such as combinations of diodes and resistors or MOSFET transistors. These standard electronic components are largely available and have a low cost.

The coupling arrangement may be adapted to couple to different kinds of powering/contact surfaces, either planar or non planar.

The coupling arrangement may be adapted to different levels of current or voltage, be they used to supply power to consumer devices, professional electronic equipment, or electrical vehicles.

The coupling arrangement may provide connections to a plurality of buses. In addition or as alternatives to a connection to a power line, the coupling arrangement may provide connection to other kinds of buses to transmit data between the device and, for instance, a storage device, a fixed line connection to a server, or any kind of other connection that uses a bus, standard compliant or not.

In some embodiments, the coupling arrangement may be configured to allow a normal use of all the ports of the device, even when the device to be powered is coupled to a powering device.

In some embodiments, the coupling arrangement may be incorporated in a shell adapted for the device. Optionally, for a better ease of use, it may be configured to be retractable in the shell of the device.

BRIEF DESCRIPTION OF THE DRAWINGS

The invention and its advantages will be better understood upon reading the following detailed description of some embodiments, given purely by way of non-limiting example, this description being made with reference to the accompanying drawings in which.

DETAILED DESCRIPTION

Figure 1:
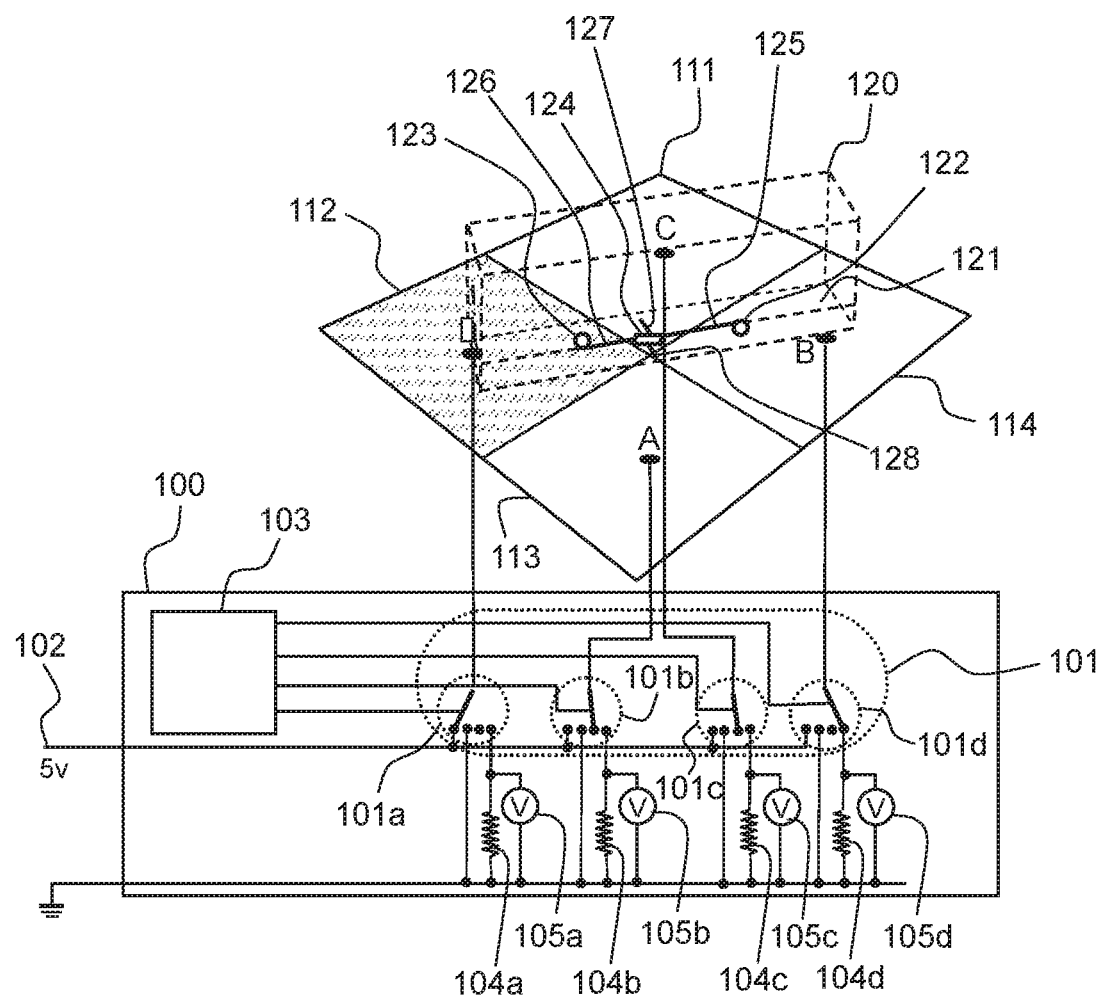
FIG. 1 represents a schematics of a mating surface with a circuitry configured to engage with a coupling arrangement according to the invention.

FIG. 1 represents a schematic of a mating surface with a circuitry configured to engage with a coupling arrangement according to the invention.

As shown in FIG. 1, there is provided a coupling interface 100 for establishing an electrical connection with an electrically conductive article or device 120, through a coupling arrangement 121 according to the invention, that will be described with more details further down in the description. The coupling arrangement 121 may be inside the device 120 or engaged therewith on an external side. The coupling arrangement has a number of electrical contact areas or dots, two dots 122, 123 in the embodiment represented on the figure to establish electrical contact with a mating surface comprising conductive regions 111, 112, 113, 114. The dimensions of the dots and the distance between them will be discussed further down in the description in relation with FIGS. 5a and 5b. There may be more than two dots as will be discussed in relation with FIG. 2. The coupling arrangement comprises one or more electronic circuits 124 with a first input/output (I/O) 125 and a third I/O 126 that connect to the dots 122, 123 and a second I/O 127 and a fourth I/O 128 that connect to a bus connection of the device 120. A bus connection designates a plurality of wire connections that may be a power line or a data line or a combination thereof. The power line may be a 5 V power line, a 12 V, another value in the same range or a much higher voltage power line, as illustrated for instance on FIG. 7, where 240 V AC and 500 V DC voltages are commonly used. The data line may be configured to comply to one or more of numerous standard or proprietary buses like an USB bus, a micro USB bus, an USB-C bus, a Firewire bus, an HDMI bus, a VGA bus, a Thunderbolt bus, a Lightning bus, an Ethernet bus, or any display port in a mini, micro or other form, or any port to connect a specific device . . . A USB bus comprises a power line that has a 5V wire and a ground wire as well as a data line that comprises a D⁺ wire and a D⁻ wire. The USB bus has therefore two lines and four connections, wires or pins. When engraved on a PCB, the USB bus will have four tracks. While they correspond to different technologies, the designations connections, pins, wires or tracks will be considered as being synonymous in this description for a USB bus as well as for other kinds of buses.

An embodiment of a coupling interface 100 that is configured to test some electrical properties of the device 120 through the coupling arrangement 121 is described below by way of enabling structure to interface with the coupling arrangement of this invention.

The coupling interface 100 controls a plurality of conductive regions 111, 112, 113, 114, constituting a mating surface, each conductive region 111, 112, 113, 114 being switchably coupled, for example by means of electronically controlled switches 101 under the control of the coupling interface 100 to a first voltage, here shown by way of example as a 5 v supply voltage on supply line 102. The coupling interface 100 further comprises a controller 103 configured to sequentially select each region 111, 112, 113, 114 and to couple the instantaneously selected region (say 112 for example at a given instant) to the first voltage in a first state, and to measure a respective electrical property such as current through or voltage as discussed below, of each of the plurality of regions other than said selected region (that is, regions 111, 113, 114 at that given instant). In a case where the electrical property for any region 111, 113, 114 exhibits a first predetermined characteristic, the article 120 is considered to be coupled across the selected region 112 and the region exhibiting the first characteristic.

It will be appreciated that while the mating surface as shown comprises a number of square conductive regions in a plane, other embodiments may use conductive regions of any shape, and each conductive region, or certain groups of conductive regions may vary in shape. The conductive regions need not be in a planar arrangement, but could conform to any three dimensional surface. The conductive regions may be separated with gaps or dielectric filler of varying dimensions, depending on the corresponding dimensions of the article as discussed below. Accordingly, while in some embodiments squares, hexagons or other tessellating shapes may be used in a planar disposition with minimal dielectric separations, in other embodiments the conducting regions may be of arbitrary two or three dimensional form.

As mentioned above, in the first state in one variant, each of the plurality of regions other than the selected region is coupled in turn or in parallel to a second voltage defining a first potential difference with respect the first voltage, and the electrical property is a current flow from the selected region and a respective region coupled to the second voltage. By way of example, if the first voltage is 5 V as discussed above, the second voltage may be 0 v.

Alternatively, each of the plurality of regions 111, 113, 114 other than said selected region 112 is coupled in turn to a second voltage, the second voltage defining a first potential difference with respect the first voltage, via a respective known resistance 104a, 104b, 104c, 104d, and said electrical property is the respective voltage across each known resistance 104a, 104b, 104c, 104d.

As shown in the arrangement of FIG. 1, each of the switches 101a, 101b, 101c, 101d has four positions, with the first position of each switch being coupled to the 5v supply line 102, the second position coupled to the ground plane, the third position floating and the fourth position coupled to ground by the respective resistance 104a, 104b, 104c, 104d as discussed above. As such, the arrangement of FIG. 1 is able to implement either variant, by using the second position to couple the regions other than the selected region to ground in the first variant, or using the fourth position to couple the regions other than the selected region to ground via a respective known voltage in the second variant. It will be appreciated that implementations need not support both variants.

As shown, the first switch 101a corresponding to the conductive region 112, which in the current example is taken to be the selected region is in the first position coupling region 112 to 5v. Switches 101b and 101c corresponding to regions 111 and 113 are in the third position leaving these regions floating or regions having a high impedance. Switch 101d is in the fourth position, coupling the conductive region 114 to ground via known resistance 104d. The voltage across resistance 104d can be measured by voltmeter 105d. In accordance with the preceding discussion, in other phases regions 111 and 113 will be similarly coupled across their corresponding resistances whilst the other regions other than the presently selected region (112) are left floating.

The coupling interface is adapted in a case where the electrical property for any region exhibits said first predetermined characteristic (that is, a characteristic voltage change or current flow) to enter a second state.

In this second state, the selected region is coupled to a third voltage, and the region exhibiting the first characteristic is coupled to a fourth voltage, where the fourth voltage defining a second potential difference with respect to said third voltage of opposite polarity to said first potential difference. For example, the voltages of the two regions may simply be swapped. In the case of FIG. 1, this would mean changing switch 101a to position 4 and switch 101d to position 1.

The respective electrical property of the selected region (presently 112) may then be measured, and in a case where the electrical property for the selected region exhibits a second predetermined characteristic, considering said article to be a power consuming electrical device coupled said selected region and said region exhibiting said first characteristic.

On this basis the interface may select in turn each conductive region, and test each other region first with one polarity, then with the opposite polarity if the first characteristic is detected, before proceeding to select a new conductive region and test each other region with respect to the newly selected region, until every region has been tested with respect to every other region.

The measurement of the first electrical property may be performed by any convenient method. For example, it may be measured by Analog to digital converters, moving coil galvanometer, hall effect sensor or otherwise.

As such, the embodiment of FIG. 1 presumes a difference in behavior depending on the polarity of the voltage across a device-specifically, a first characteristic voltage drop or current flow with one polarity, and a second characteristic voltage drop or current flow with the opposite polarity. In other words, the presence of an electronic circuit adapted to perform a first anti-inversion of current function between the first I/O and the second I/O and a second anti-inversion of current function between the fourth I/O and the third I/O.

Where no such difference is detectable, any voltage drop or current flow detected may be presumed to be due to a spurious connection not corresponding to a power consuming electrical device due to a short circuit or resistive electrical connection across the two conductive regions for example. If different characteristics are detectable, the conductive article may be presumed to be a powerable device. In some embodiments, the test may be repeated to eliminate a false positive, due for instance to a vibration.

Accordingly, in a case where the electrical property for the selected region exhibits a third predetermined characteristic, that is, one of a set of values not corresponding to the second characteristic, the interface is adapted to consider the article to be a conductive article creating a short circuit between said selected region and the region exhibiting the first characteristic.

This characteristic behavior in the face of different electrical conditions implies certain characteristics in a power consuming electrical device enabling it to be distinguished from a spurious connection not corresponding to a power consuming electrical device. These characteristics may be achieved by including certain electronic components in power consuming electrical device itself, or in an interface token positioned between (in an electrical sense) the power consuming electrical device and the conductive regions.

Other coupling interfaces 100 may be designed as variants of the one described above with the same structure or the coupling arrangement 121 of this invention.

In some embodiments, the coupling arrangement of the invention may be operable without a coupling interface, the positioning on the mating surface of the device comprising the coupling arrangement being effected based on the respective geometries of the conductive regions and the coupling arrangement.

Figure 2:
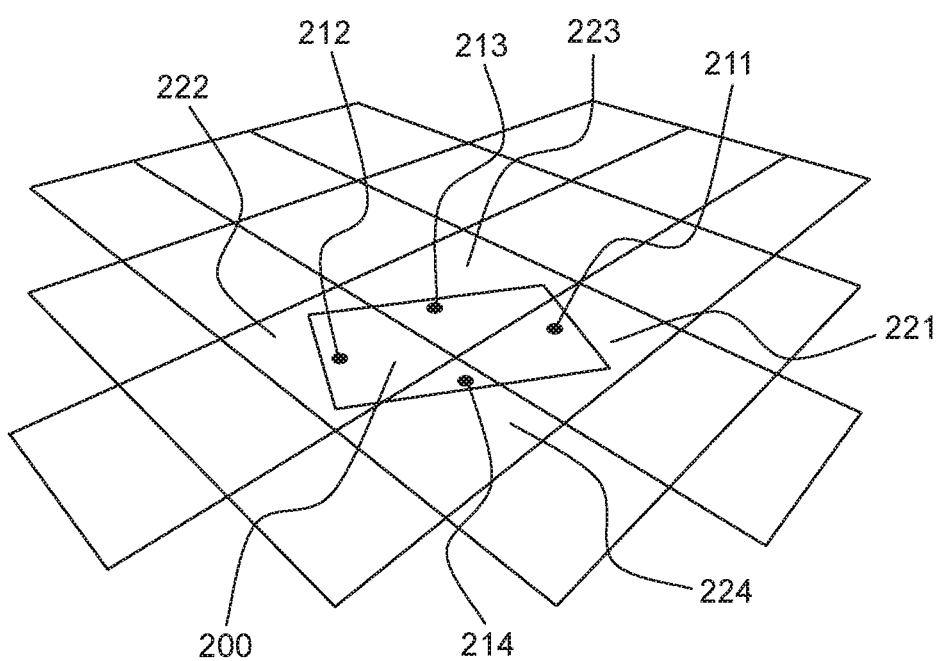
FIG. 2 represents a variant of the coupling arrangement of FIG. 1 according to some embodiments of the invention.

FIG. 2 represents a variant of the coupling arrangement of FIG. 1 according to some embodiments of the invention.

The coupling arrangement of FIG. 2 comprises four dots (i.e. electrical contact areas) 211, 213, 212, 214 that are configured to respectively mate with conductive regions 221, 223, 222, 224. Dots 211, 213 are connected to the ports of a first line of a bus through an electronic circuit (neither the ports nor the electronic circuit being represented on the figure). Dots 212, 214 are connected to the ports of a second line of a same bus or of another bus through an electronic circuit (neither the ports nor the electronic circuit being represented on the figure). All four dots may be connected to a single electronic circuit or two different electronic circuits. The first bus may be a power line or a data line. As well, the second bus may be a power line or a data line. In some embodiments, both first and second bus may be power lines powered with different currents. In such an embodiment, a switch will need to be provisioned in the coupling arrangement 121 or in the device 120 itself, so that the adequate current is sent to the device. Alternatively, both first and second bus connections may be data lines.

In some embodiments, the coupling arrangement 121 of the invention may comprise more than four dots and accommodate more than two buses. There will be at least as many dots as there are bus wires.

The conductive regions 221, 223 are the connections to the counterpart connections of the first bus in the coupling interface 100. The conductive regions 222, 224 are the connections to the counterpart connections of the second bus in the coupling interface 100.

The coupling interface 100 will be configured to test both the first bus and the second bus (or more than two buses). In some embodiments, the structure of the coupling interface 100 may be duplicated. In some other embodiments, the structure of the coupling interface may comprise common components that drive the first bus connection and some other components that drive the second bus connection.

It may be advantageous to conform the geometry of the respective conductive regions 211, 213, 212, 214 in such a way that the configuration optimizes both the structure of the mating surface and the geometry of the coupling arrangement.

Figure 3A:
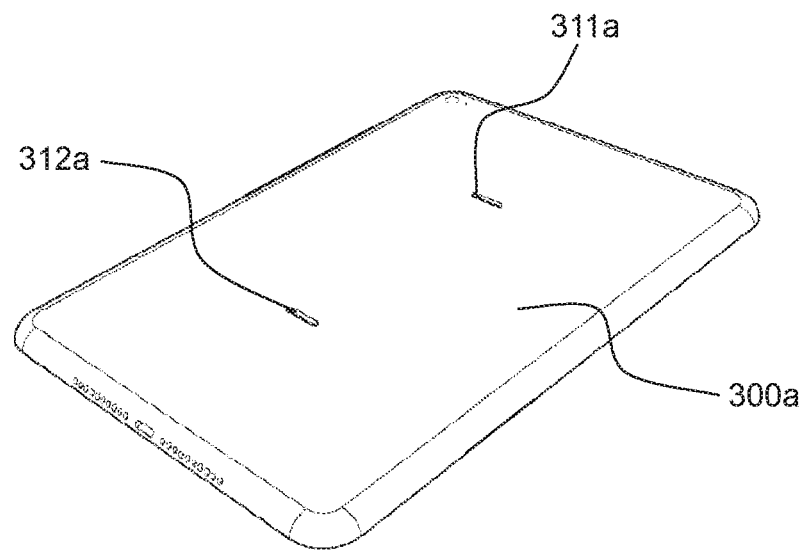
FIGS. 3a and 3b represent two exemplary embodiments of a user device respectively with a coupling arrangement inside a device and outside the device.
Figure 3B:
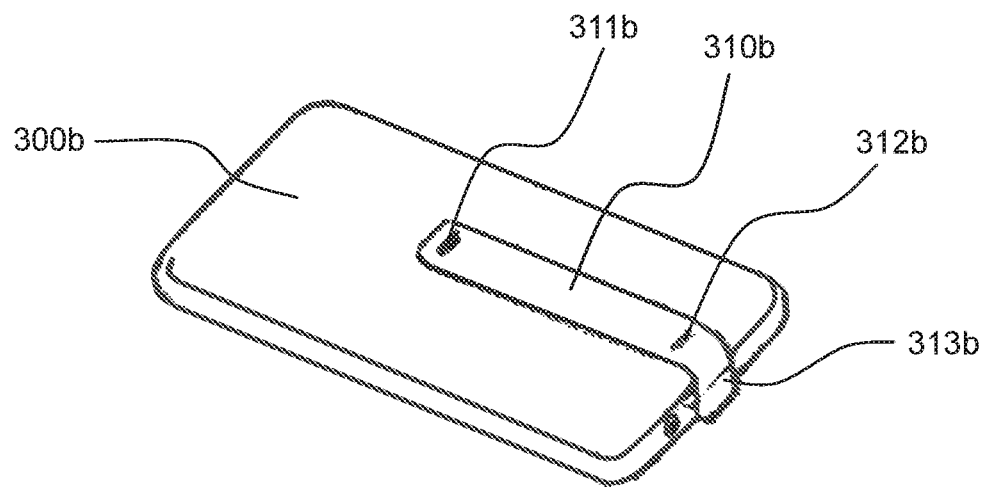

FIGS. 3a and 3b represent two exemplary embodiments of a user device respectively with a coupling arrangement inside a device and outside the device.

In a first class of embodiments of the invention, FIG. 3a represents a smart phone 300a seen from its back surface (opposite to the display of the smart phone). The back surface of the smart phone 300a comprises two dots 311a, 312a that are configured and positioned to engage with a mating surface in a manner and at positions that will be described further below in the description in relation to FIGS. 5a and 5b.

The dots 311a, 312a are connected to a bus connection through an electronic circuit that are both located in the interior of the smart phone. Neither the bus connection nor the electronic circuit are represented on the figure. The electronic circuit comprises first, second, third and fourth I/Os (not shown on FIG. 3a) as the electronic circuit 124 of FIG. 1. The coupling arrangement is integrated in the smart phone 300a at the time of designing and manufacturing said smart phone, in a manner known to a person of ordinary skill in the art of design and manufacturing smart phones.

In some embodiments, more than two dots may be provisioned on the back surface of the smart phone 300a. For example, four dots may be provisioned to be able to connect a plurality, for instance three or four, bus wires of the smart phone 300a. Some of the wires may form a power line and some other bus wires may form a data line, constituting a bus of the USB type, or of another type. Other variants, with more dots and more bus wires may be provisioned on the back surface. In such variants, the dimensions and the locations of the dots have to be selected to mate to the conductive regions defined on the mating surface.

The coupling arrangement of the invention may also be integrated in other devices or equipment than smart phones. By way of example only, these devices may be laptops, tablets, e-cigarettes, lamps, coffee machines, IoT object or the like, etc. . . . . . Conductive regions similar to conductive regions 221, 223, 222, 224 of FIG. 2 may be configured in different contiguous or non contiguous areas to accommodate different types of equipments on a same mating surface, for example a desk, a table, a kitchen working surface, a bar, a counter, etc . . . .

In a second class of embodiments of the invention, FIG. 3b represents a smart phone 300b seen from its back surface (opposite to the display of the smart phone). A coupling arrangement 310b is represented engaged with the smart phone 300b. The coupling arrangement may be engaged with the smart phone through a magnet. The coupling arrangement 310b comprises two dots (i.e. electrical contact areas) 311b, 312b, that have the same function as the dots 311a, 312a of FIG. 3a. The coupling arrangement 310b also comprises a member 313b that is configured to mate to a port of the smart phone that is connected to one or more buses, including a power line and one or more data lines. The coupling arrangement 310b also comprises an electronic circuit (not displayed on the figure) that is located inside the structure of the coupling arrangement.

The dots 311b, 312b will be configured to mate to conductive regions like conductive regions 111, 113, 112, 114 of FIG. 1 or conductive regions 221, 223, 222, 224 of FIG. 2.

Other geometric configurations of the coupling arrangement are also possible. For instance, the coupling arrangement may have a wider width to accommodate more than two dots and/or more than one port connection.

In a variant of this class of embodiments, the coupling arrangement may be integrated in a protection shell of the smart phone.

Other types of coupling arrangements may be specifically configured to mate to other devices or equipments like laptops, tablets, watch, e-cigarettes, lamps, coffee machines, etc . . . .

The description of variants of mating surfaces that are fit to mate with devices or equipments equipped with various configurations of coupling arrangements also applies to this class of embodiments.

FIGS. 4a, 4b, 4c and 4d represent four exemplary embodiments of an electronic circuit integrated in a coupling arrangement according to the invention.

On the four figures, four input/ouput (I/O) of the electronic circuit 400 are represented:

I/Os 411, 413 are connected to the dots of the coupling arrangement that are configured to mate with the mating surface;

I/Os 412, 414 are configured to be put in electrical connection with a bus connection of the device; if the coupling arrangement is integrated in a device, the I/Os are in permanent electrical connection with a bus connection of the device; if the coupling arrangement is an external element, the I/Os are connected to a port configured to mate to a corresponding port of a device.

I/Os 411 and 412 may be the higher voltage part of the connection (for instance 5 V) or the lower voltage (for instance 0 V) part of the connection and conversely for I/Os 413 and 414. The lower voltage part of the connection may be a ground connection.

In some advantageous embodiments, a resistance 420 is provisioned in the electronic circuit. The resistance may be a discrete component or may be part of one of the other components. It may also be a combination of resistances internal to some other components or discrete. The resistance should have a value that is set as a function of the value of the higher voltage part of the connection and the detection threshold that is configured in the coupling interface. Conversely, the parameters of the detection routine of the coupling interface are configurable to be adapted to various values of the resistance that may each characterize a different level of power voltage that is detected when a device is correctly positioned on a mating surface. The known resistance will be used by the coupling interface to determine whether the voltage difference between the second I/O and the fourth I/O is in a specified range when the first I/O and the third I/O are connected to certain conductive regions through the dots of the coupling arrangement. In some embodiments depicted in one of FIGS. 4a, 4b, 4c and 4d, the resistance 420 may the internal resistance of one of the connections of a MOSFET transistor. Such a resistance has a value that may be known from the data sheet of the component.

The other components of the electronic circuit may vary between the four embodiments of FIGS. 4a, 4b, 4c and 4d.

Figure 4A:
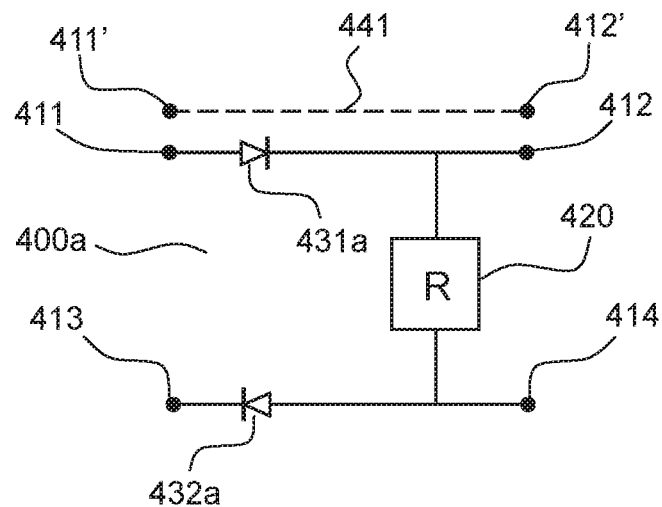
FIGS. 4a, 4b, 4c and 4d represent four exemplary embodiments of an electronic circuit integrated in a coupling arrangement according to the invention.

On FIG. 4a is represented a first embodiment of an electronic circuit 400a according to the invention that comprises one or more diodes 431a, 432a. In some embodiments, only one of the diodes 431a or 432a may be provisioned. A single diode or additional diodes may be provisioned at other positions in the electronic circuit, for instance between the second I/O, 412 and the fourth I/O, 414. It is also possible to provide any combination of components comprised in the electronic circuit 400a and/or circuits of the controlled that allow the current to flow only from the first I/O 411 to the second I/O, 412, and from the fourth I/O, 414 to the third I/O, 413. This family of configurations will be described by way of example only, from the embodiment depicted on FIG. 4a that comprises two diodes, but a person of ordinary skill will be able to deduct directly and unambiguously the variants with a lower or a higher number of anti-inversion functions. The first diode 431a is in a passing state for a current flowing from the first I/O 411 to the second I/O 412. The second diode 432a is in a passing state for a current flowing from the fourth I/O 414 to the third I/O 413. Each diode performs an anti-inversion of current function between these respective I/Os. One or more of the diodes 431a, 432a may be replaced by another similar component.

Other bus wires may connected to additional dots to allow connecting more than one line. For instance, additional bus wire 441a may join I/O (dot) 411' and I/O 412'. An additional diode may be provisioned in-between the two I/Os similar to diode 431a between I/O 411 and I/O 412.

Figure 4B:
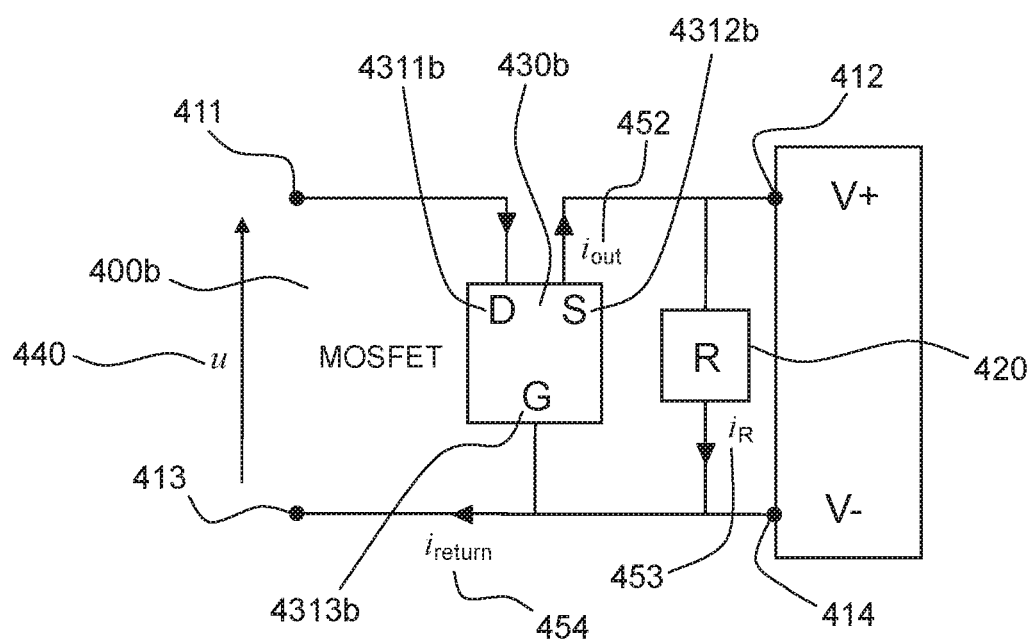

On FIG. 4b is represented a second embodiment of an electronic circuit 400b according to the invention that comprises a MOSFET-P transistor 430b that has a source, 4311b, a drain 4312b and a gate 4313b. The drain to source connection operates as a diode that is passing for the current flowing from the first I/O 411 to the second I/O 412. This connection performs a first anti-inversion of current function between these I/Os. The drain to gate leakage current participates in the control of the flow of current from the fourth I/O 414 to the third I/O 413, thus performing a second anti-inversion of current function between these I/Os.

Figure 4C:
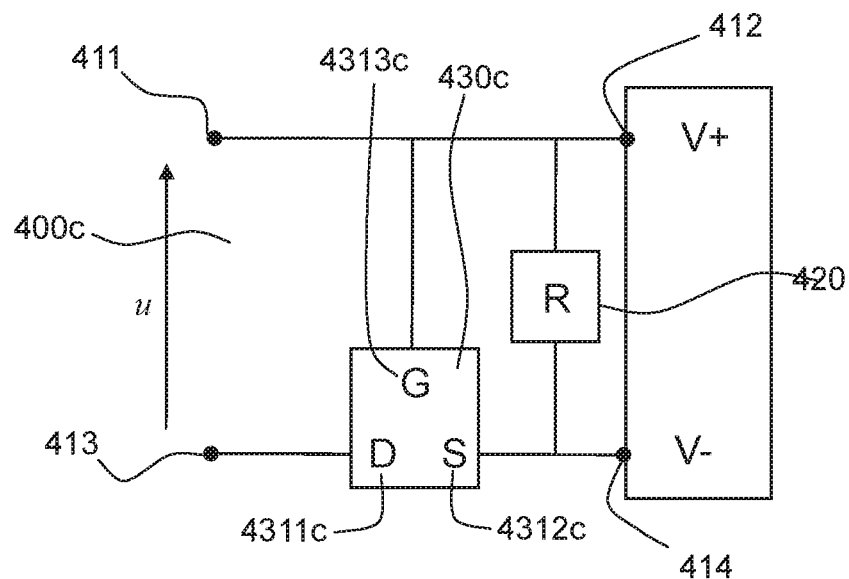

On FIG. 4c is represented a third embodiment of an electronic circuit 400c according to the invention that comprises a MOSFET-N transistor 430c that has a source, 4311c, a drain 4312c and a gate 4313c. The source to drain connection operates as a diode that is passing for the current flowing from the fourth I/O 414 to the third I/O 413, thus performing a first anti-inversion of current function between these I/Os. The gate current controls the flow of current from the first I/O 411 to the second I/O 412. It operates as a diode that is passing from the first I/O to the second I/O, thus performing a second anti-inversion of current function between these I/Os.

Figure 4D:
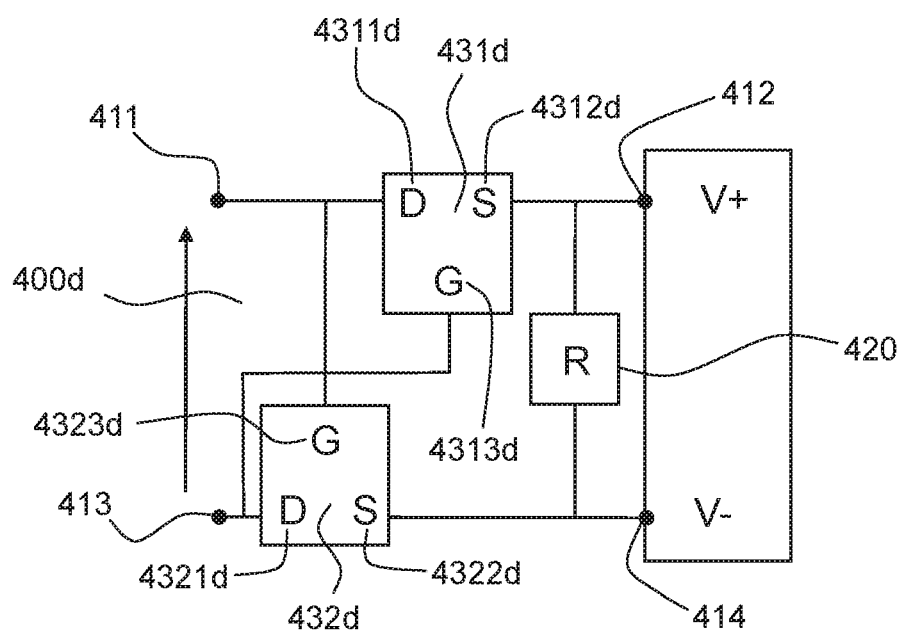

On FIG. 4d is represented a fourth embodiment of an electronic circuit 400d according to the invention that comprises a MOSFET-P transistor 431d and a MOSFET-N transistor 432d. The MOSFET-P transistor 431d has a source, 4311d, a drain 4312d and a gate 4313d. The MOSFET-N transistor 432d has a source, 4321d, a drain 4322d and a gate 4323d. In this combination, the leakage current of the gate 4323d of the MOSFET-N transistor 432d controls the current flowing from the first I/O 411 to the second I/O 412, through the drain to source connection of the MOSFET-P transistor 431d, thus performing a first anti-inversion of current function between these I/Os. Meanwhile, the leakage current of the gate 4313d of the MOSFET-P transistor 431d controls the current flowing from the fourth I/O 414 to the third I/O 413, through the source to drain connection of the MOSFET-N transistor 432d, thus performing a second anti-inversion of current function between these I/Os.

The electronic circuit of the coupling arrangement of the invention is configured to perform two functions, a detection function and a protection function.

By way of example, reference is made to the embodiment of FIG. 4b. The electronic circuit 400b detects if the voltage u, 440 between the first I/O 411 and the third I/O 413 is positive or negative. If it is positive, the anti-inversion functions 4311b, 4312b and 4311b, 4313b will be in a passing mode and the currents $i_{out}$, 451b, $i_R$, 452b and $i_{return}$, 453b will be flowing. If it is negative, the anti-inversion functions 4311b, 4312b and 4311b, 4313b will be in a blocking mode and the currents $i_{out}$, 451b, ix, 452b and $i_{return}$, 453b will be null. Also, if u>$u_{th}$, (where $u_{th}$ is a threshold value that is higher than or equal to the gate threshold voltage of the MOSFET transistor) the gate will switch to a blocking state, and $i_{return}$, 453b will be null.

The components of the electronic circuit may be integrated in a same ASIC or implanted as discrete components in the coupling arrangement. In the embodiments where the coupling arrangement is integrated in a device, the electronic circuit may be implanted in another circuit of the device.

The different variants of electronic circuits represented on FIGS. 4a, 4b, 4c and 4d may be selected to be integrated in a coupling arrangement of the invention, depending on the functional specification of the application (i.e. number of bus wires; voltage of the power line; need for a specific protection, etc. . . . ), constraints on form factor and budget.

Figure 5A:
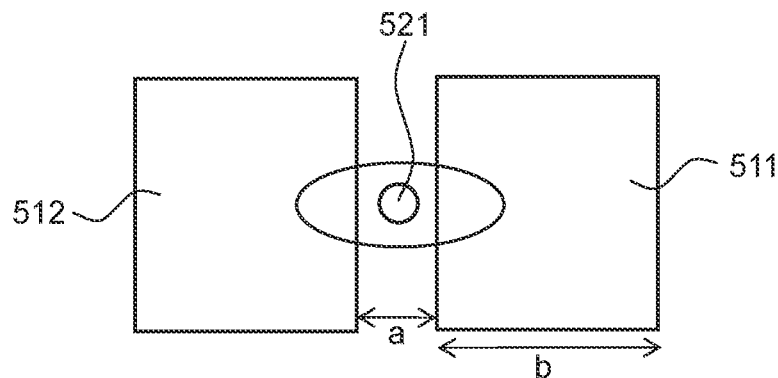
FIGS. 5a and 5b illustrate a calculation of characteristic dimensions of elements of the coupling arrangement according to the invention.
Figure 5B:
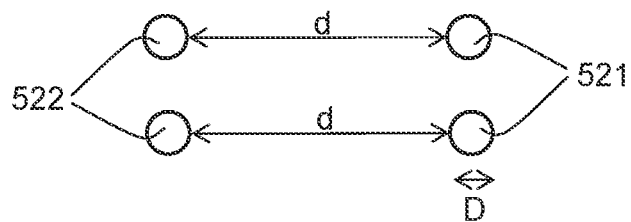

FIGS. 5a and 5b illustrate a calculation of characteristic dimensions of elements of the coupling arrangement according to the invention.

FIG. 5a illustrates characteristic dimensions of conductive regions of the mating surface 511, 512. While the conductive regions may have any form factor, they are represented on the figure as squares of side length "b" with an interstitial space between them "a". If the conductive regions have another form factor, the characteristic dimension b' will be taken as the diameter of a circle in which the form factor is inscribed.

FIG. 5b illustrates characteristic dimensions of dots (i.e. electrical contact areas) 521, 522. While the dots may be rectangles, squares, triangles, or of any other form factor, they are represented as a circle of diameter "D" on the figure. The distance between the two dots 521, 522 is denoted "d".

According to some prior art documents (notably international application WO2017/046458 assigned to the inventors of the instant application), the dimension D of the dots had to be smaller than a to avoid the risk of a short circuit between two contiguous conductive regions. According to the invention, this constraint is no longer absolute, since short circuits are prevented thanks to the anti-inversion functions of the electronic circuit of the coupling arrangement. It is nevertheless desirable to limit the occurrence of situations where the device will not be correctly connected to adequate conductive regions. There, having D smaller than a will help achieve this goal by minimizing the occurrence of situations where the device cannot be correctly coupled to the mating surface.

A constraint remains on the distance d between the dots. In order to make sure that the two dots 511, 512 may establish two electrical contacts with two different conductive regions 521, 522, it is necessary that d be higher than b'. Or in the case where the form factor of the conductive regions is a square form, that the following inequality be satisfied (Δ being a tolerance margin that is added to make sure that the dimensions are always in the correct relationship): d>(b×√2)+Δ

Figure 6A:
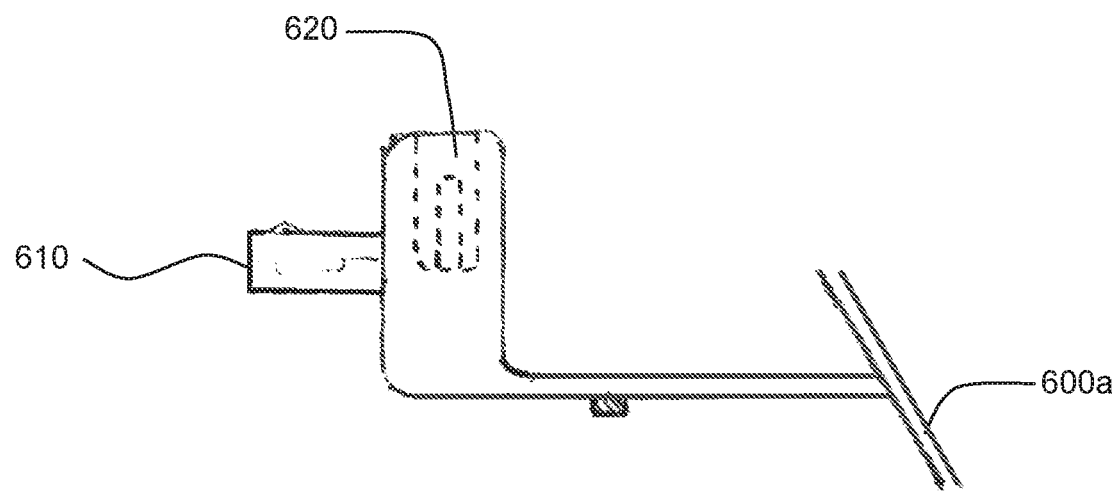
FIGS. 6a and 6b represent two variants of coupling arrangements according to the invention.
Figure 6B:
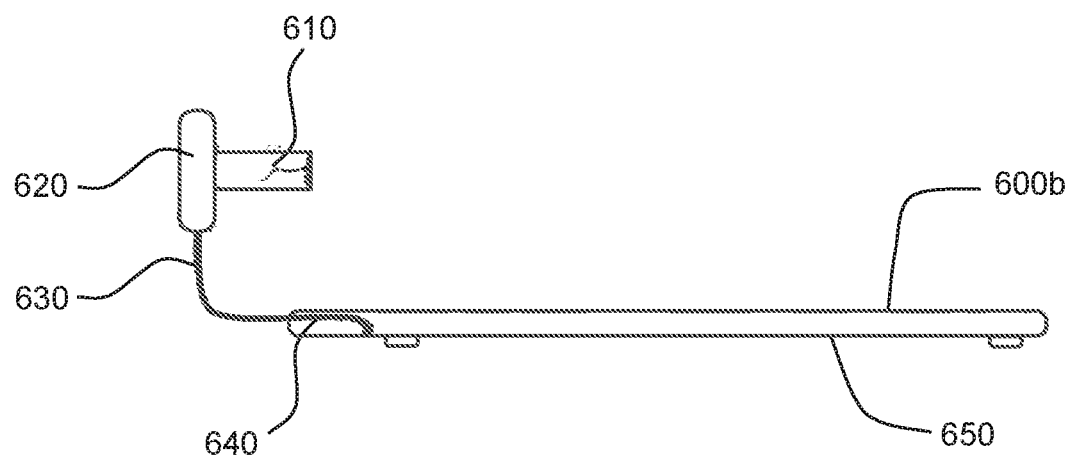

FIGS. 6a and 6b represent two variants of coupling arrangements according to the invention.

According to some embodiments of the invention, the coupling arrangement 600a, that is configured to mate with a user device, has a male port 610 to engage in a female port of the device, the said female port being the connection port of one or more bus connections. To enable users to use some of the bus connections that are not connected through the mating surface, it is advantageous to provision a female port 620 that is a duplicate of the port in which the male port 610 will be engaged. Thus, the device will still be operable as if there was no male port 610 engaged in the female port of the device. In some embodiments, the female port 620 is perpendicular to the male port 610. The female port 620 may be configured to be located, when the male port 610 is engaged in the female port of the device, in the plane of a main surface of the device or perpendicular to this main surface. This configuration achieves a good compromise between the thickness of the combination of the two ports and the ease of use of the two ports.

In a variant depicted on FIG. 6b, the coupling arrangement 600b is integrated in a shell 650 of a smart phone. In such variant, it is advantageous to have the male/female plug, 610, 620 configured to be housed within a part 640 of the shell 650. To achieve this result, a flexible connector or wire link 630, comprising a spring or any other mean to make the connector 630 retractable upon a manual action of the user will be provisioned. When the coupling arrangement is not used, the flexible connector is retracted in the housing part 640, the male and female ports, 610, 620 being configured to be also retracted in the housing or close to the housing. Conversely, when the coupling arrangement is in use, the user pulls the ports 610, 620 and the flexible connector 630 from the housing 640.

As already mentioned, the coupling arrangement may be simply embedded in a shell without female port and/or without retractable wire.

Figure 7:
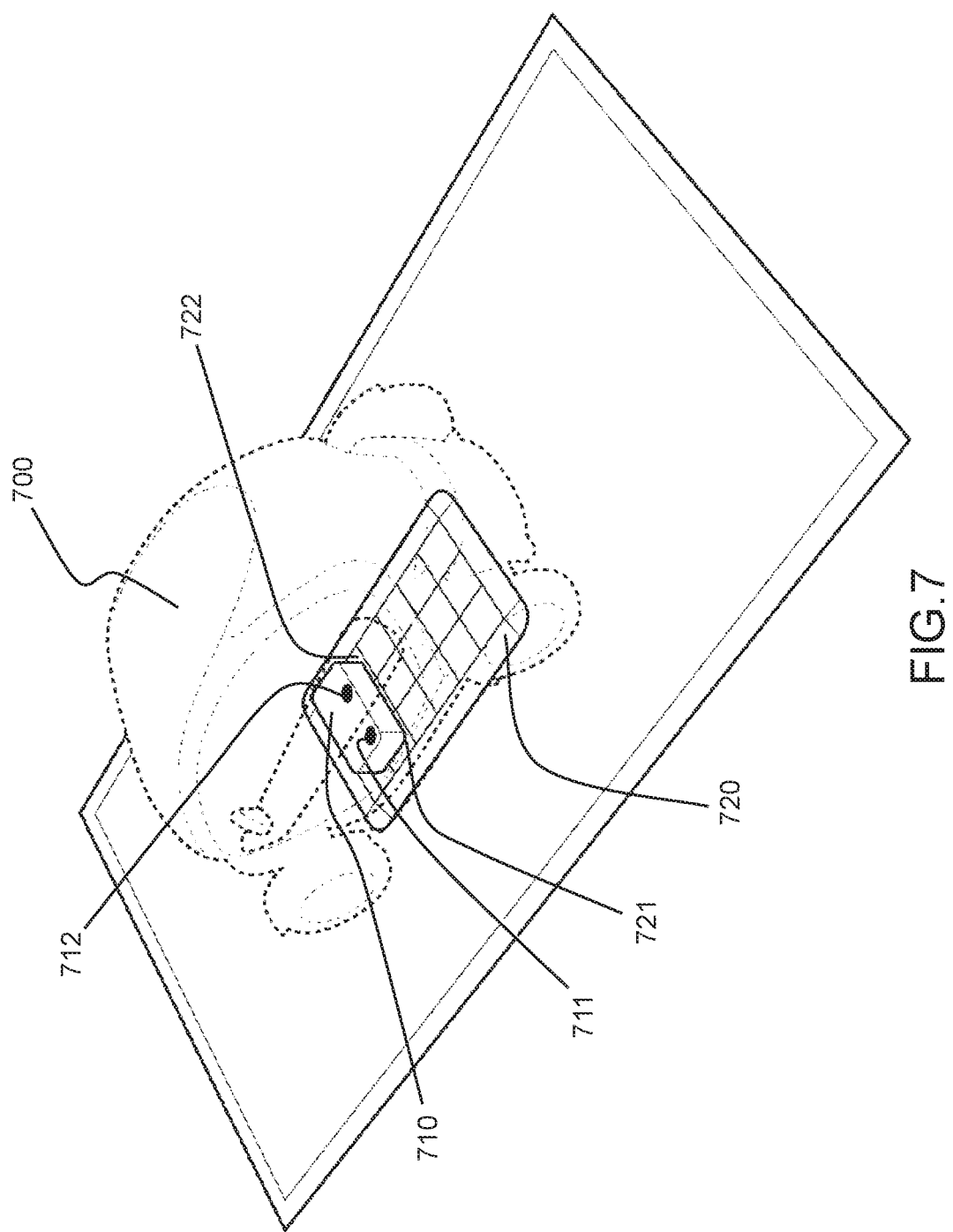
FIG. 7 illustrates an embodiment of the invention wherein a user equipment is positioned to be powered.

FIG. 7 illustrates an embodiment of the invention wherein a user equipment is positioned to be powered.

The use of a coupling arrangement according to the invention is not limited to small objects. It may for instance also be used to connect vehicles 700 to a powering station 720.

The vehicles may be electric vehicles or rechargeable hybrid vehicles. They may be terrestrial vehicles such as bicycles, motorcycles, autos, buses, trucks, tractors, etc. . . . . They may be aerial vehicles such as drones, aeroplanes or helicopters.

A powering station 720 may be configured as a mating surface of the type already discussed in other embodiments. Conducting regions 721, 722, are provisioned to mate to a coupling arrangement 710 that has dots or electrical contact areas 711, 712. A difference would be in the dimensions of the conducting regions that need to be of large enough dimensions to accommodate a coupling arrangement that would be large enough to transfer power of a significant amount to a vehicle. Also, the dots will be commensurate. Likewise for the electronic circuit that needs to comprise power components that are able to dissipate the type of power needed to recharge vehicles. For electric automotive vehicles, there exist two standards of charging stations. A first standard (designated as Type 2) uses Alternative Current with a 240 V voltage. A second standard (designated as DC Fast Charge) uses continuous current with a 500 V voltage.

In such an embodiment, the mating surface should be configured in manner where users or passers-by cannot walk thereon when it is powered. Also, the components of the electronic circuit in the coupling arrangement will have to be power components.

Figure 8:
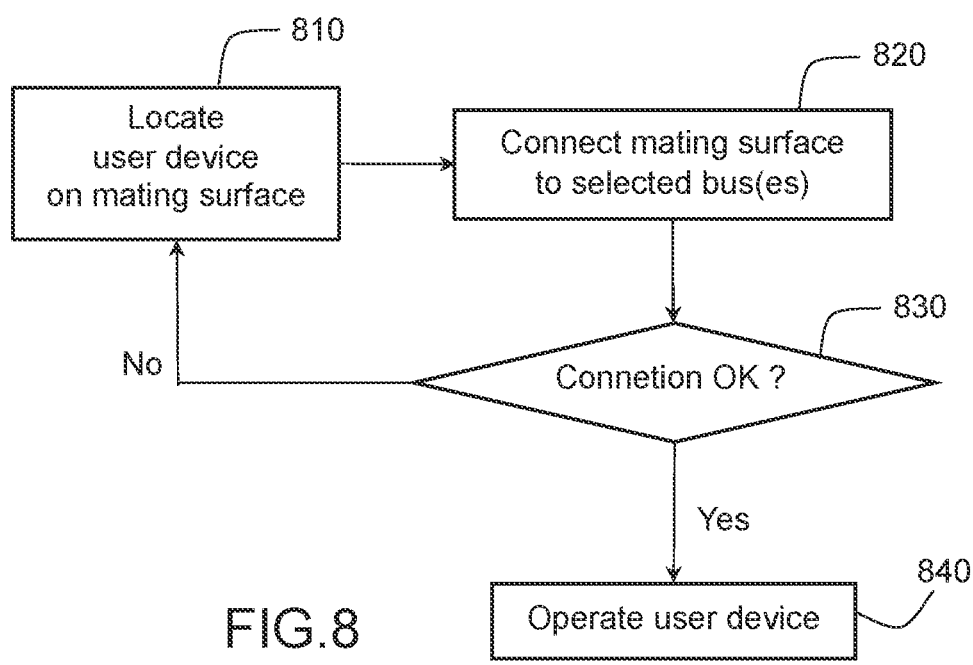
FIG. 8 represents a flow chart of a method to operate a user device according to the invention.

FIG. 8 represents a flow chart of a method to operate a user device according to the invention.

The test of the connections between the device and the coupling arrangement of the device is assessed at the coupling interface. The user needs to perform actions to possibly adjust the position of the device to the mating surface.

At a step 810, a first position of the device equipped with its coupling arrangement according to the invention is determined by the user. The configuration of the coupling arrangement (distance between the dots) is such that in most situations, the location should allow a proper connection of one or more bus connections to be established.

When the device is positioned on the mating surface, at a step 820, the connections of the bus connections are attempted.

At a step 830, a test is performed to determine whether the connections are correctly established. Lights of different colors may be provisioned for each bus connection to inform the user if any of the connections has failed. For instance, green and red may be used for one bus connection, and blue and yellow for a second bus connection. Also, different lights with numbers indicating the connections and green and red colors for each connection may be provisioned. Alternatively, sound signals can be emitted by the coupling arrangement. If the connections are OK, the device may be operated as envisaged (step 840). If not, the user should reposition the device with its coupling arrangement at another location on the mating surface (redo step 810).

The examples disclosed in this specification are only illustrative of some embodiments of the invention. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

They do not in any way limit the scope of said invention which is defined by the appended claims.

The invention claimed is:

1. A coupling arrangement configured to switch one or more bus wires between a device and a mating surface between a closed state and an open state, the coupling arrangement comprising:

at least as many electrical contact areas between the device and the mating surface as a count of the one or more bus wires;

one or more electronic circuits, having together at least a first input/output, a second I/O, a third I/O and a fourth I/O, the first I/O and the third I/O being connected to the electrical contact areas, the second I/O and the fourth I/O being configured to be put in electrical connection with a respective one of the one or more of the bus wires of the device;

wherein the device being electrically powered by a characteristic voltage across two of the one or more bus wires; and wherein the electronic circuit is adapted to perform one or more of a first anti-inversion of current function between the first I/O and the second I/O or a second anti-inversion of current function between the fourth I/O and the third I/O, wherein the electronic circuit comprises a resistance of a predetermined value between the second I/O and the fourth I/O, wherein said predetermined value is set as a function of the value of said characteristic operating voltage, whereby said resistance is detected when said device is correctly positioned on said mating surface.

2. The coupling arrangement of claim 1, wherein the bus connection is in a closed state when a voltage of the first I/O equals a first voltage value within a predefined tolerance margin and a voltage of the third I/O equals a second voltage value within the predefined tolerance margin.

3. The coupling arrangement of claim 1, wherein the bus connection is in an open state when a voltage of the first I/O equals a second voltage value within a predefined voltage tolerance margin and a voltage of the third I/O equals a first voltage value within the predefined voltage tolerance margin.

4. The coupling arrangement of claim 1, wherein the one or more electronic circuits comprise a MOSFET-P transistor the drain of which is connected to the first I/O, the source of which is connected to the second I/O and the gate of which is connected to the third I/O and the fourth I/O.

5. The coupling arrangement of claim 1, wherein the one or more electronic circuits comprise a MOSFET-N transistor the gate of which is connected to the first I/O (411) and the second I/O, the drain of which is connected to the third I/O and the source of which is connected to the fourth I/O.

6. The coupling arrangement of claim 4, wherein the one or more electronic circuits comprise a MOSFET-P transistor and a MOSFET-N transistor.

7. The coupling arrangement of claim 4, wherein a MOSFET transistor has an internal resistance between its source and gate of a predetermined value.

8. The coupling arrangement of claim 1, wherein one of the one or more bus connections is configured to transmit power from the mating surface to the device.

9. The coupling arrangement of claim 1, wherein a distance between any of the electrical contact areas and a neighboring electrical contact area is larger than a characteristic dimension of the mating surface.

10. The coupling arrangement of claim 1, wherein the electrical contact areas are located on a surface of the device and the one or more electronic circuits are located in an interior of the device.

11. The coupling arrangement of claim 10, wherein the surface of the device and the electrical contact areas are configured in such a way that, when the device is positioned on the mating surface, it is capable to hold a position of stable balance and the one or more bus connections between the device and the mating surface may be closed.

12. The coupling arrangement of claim 1, wherein the electrical contact areas and the one or more electronic circuits are located on an accessory that is configured to be engaged with the device and further comprises one or more male connectors to one or more ports of the one or more bus connections of the device.

13. The coupling arrangement of claim 12, wherein the accessory and the electrical contact areas are configured in such a way that, when the accessory is engaged with the device and the device is positioned on the mating surface, the device is capable to hold a position of stable balance and the one or more bus connections between the device and the mating surface may be closed.

14. The coupling arrangement of claim 12, wherein at least a male connector further comprises a female connector that mirrors the port in which the male connector is to be engaged, the female connector being perpendicular to the male connector.

15. The coupling arrangement of claim 13, wherein a wire link between the accessory and a male connector is retractable in the accessory.

16. A method of coupling a device and a mating surface in a manner that allows switching one or more bus wires between a closed state and an open state, the method comprising:
   providing at least as many electrical contact areas between the device and the mating surface as a count of the one or more bus wires, wherein the device being electrically powered by a characteristic voltage across two of the one or more bus wires;
   providing one or more electronic circuits having together a first input/output (I/O), a second I/O, a third I/O and a fourth I/O, the first I/O and the third I/O being connected to the electrical contact areas, the second I/O and the fourth I/O being configured to be put in electrical connection with a respective one of the one or more of the bus wires of the device;
   providing a resistance of a predetermined value between the second I/O and the fourth I/O, wherein said predetermined value is set as a function of the value of said characteristic operating voltage;
   wherein the electronic circuit is adapted to perform one or more of a first anti-inversion of current function between the first I/O and the second I/O or a second anti-inversion of current function between the fourth I/O and the third I/O, and to
   detect the resistance value when said device is correctly positioned on said mating surface.

* * * * *